United States Patent [19]

Schladitz

[11] 4,060,126
[45] Nov. 29, 1977

[54] HEAT TRANSFER BETWEEN SOLIDS AND FLUIDS UTILIZING POLYCRYSTALLINE METAL WHISKERS

[76] Inventor: Hermann J. Schladitz, 74 Plaentschweg, Munich, Germany

[21] Appl. No.: 716,096

[22] Filed: Aug. 20, 1976

Related U.S. Application Data

[60] Continuation of Ser. No. 489,095, July 17, 1976, abandoned, which is a division of Ser. No. 308,433, Nov. 21, 1972, Pat. No. 3,824,247.

[30] Foreign Application Priority Data

Nov. 22, 1971 Germany .............................. 2157807

[51] Int. Cl.² ............................................... F28F 1/10
[52] U.S. Cl. .................................... 165/133; 165/179; 165/181; 165/DIG. 8; 219/530; 219/540

[58] Field of Search ............... 165/154, 181, 179, 133, 165/DIG. 8; 29/157.3 R; 219/530

[56] References Cited

U.S. PATENT DOCUMENTS

| 2,678,808 | 5/1954 | Gier, Jr. ............................ 165/154 X |
| 3,384,154 | 5/1968 | Milton .............................. 165/181 X |
| 3,706,127 | 12/1972 | Oktay ............................ 165/DIG. 8 |

Primary Examiner—Albert W. Davis, Jr.
Attorney, Agent, or Firm—Kane, Dalsimer, Kane, Sullivan & Kurucz

[57] ABSTRACT

Improved heat transfer is obtained between a solid and a fluid by using polycrystalline metal whiskers attached to the solid member which comes in contact with the fluid.

5 Claims, 9 Drawing Figures

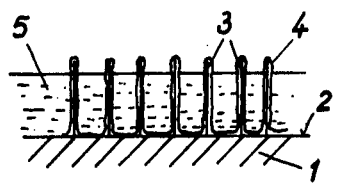
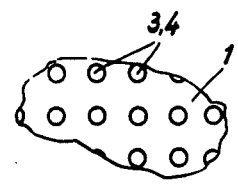
FIG.1   FIG.2
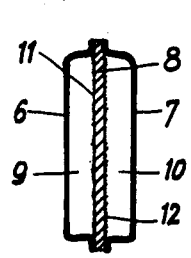
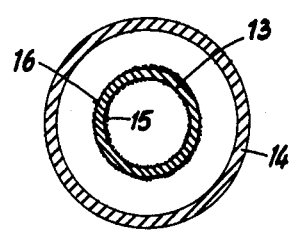
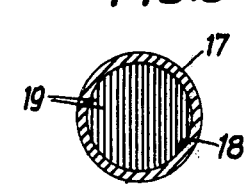
FIG.3   FIG.4   FIG.5
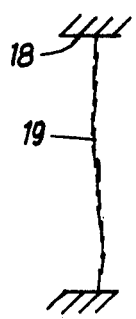
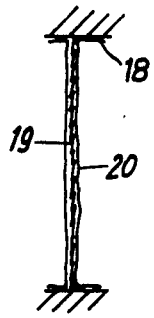
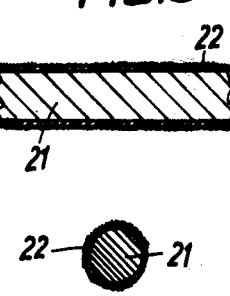
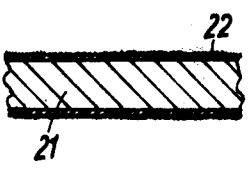
FIG.6   FIG.7   FIG.8   FIG.9

HEAT TRANSFER BETWEEN SOLIDS AND FLUIDS UTILIZING POLYCRYSTALLINE METAL WHISKERS

This application is a continuation of Ser. No. 489,095, filed 7/17/76 now abandoned, which is a division of Ser. No. 308,433, filed 11/21/72, now U.S. Pat. No. 3,824,247.

This invention relates to heat transfer elements and methods of improving the heat transmission between a solid and a fluid medium.

With heat transmission between a solid and a flowing fluid medium, liquid or gaseous, a particular problem arises with the friction of the flowing medium on the surface of the solid causing a relatively inert boundary layer of the flowing medium to form, which greatly impairs the heat transmission to or from the solid.

This invention seeks to improve heat transmission through this inert boundary layer and at the same time obtain an enlargement of the heat transfer surface of the solid.

According to one aspect of the present invention there is provided a method of improving the heat transfer between a solid and a fluid medium, wherein polycrystalline metal whiskers are attached in heat conducting manner to the surface of the solid coming in contact with the fluid medium.

According to another aspect of the present invention there is provided a heat transfer element having a heat transfer surface to which are attached in heat conducting manner polycrystalline metal whiskers.

Polycrystalline metal whiskers (see for instance "Zeitschrift Fur Wetallkunde", Volume 59 (1968) No. 1, pages 16 to 22) can be produced with accurately determined diameters from about 0.1 $\mu$m and in similarly exact predetermined lengths of up to several centimeters. These very thin whiskers penetrate the laminar fluid boundary layer over the surface of the solid. Since the coefficient of heat conductivity of metals may be several hundred times that of liquids, even if only 20% of the surface of the solid is provided with whiskers, the heat conduction through the laminar boundary layer can be improved more than a hundredfold. A further improvement in thermal conductivity may be obtained if the whiskers extend through the laminar boundary layer into the flowing medium. Also, owing to the whiskers, turbulence is generated in the boundary layer itself, which in its turn contributes to improved heat transmission. Of course the whiskers themselves increase the heat emitting or absorbing surface area of the solid.

Heat transfer elements according to this invention preferably will be coated with polycrystalline metal whiskers which have a diameter from 0.1 $\mu$m to about 50 $\mu$m. The length to be adopted and the spacing between whiskers depends on the expected thickness of the boundary layer, i.e. on the viscosity of the flowing medium. If the spacing is sufficient for the medium readily to penetrate between the whiskers, turbulence is produced in addition. Owing to the great strength of polycrystalline metal whiskers, they can withstand the pressure of the flowing medium even when the free ends of the whiskers protrude beyond the boundary layer into the flowing medium.

The solid can take the form of a partition between two cavities for gaseous or liquid media, as for heat exchangers. In this case both sides of the partition are preferably provided with polycrystalline metal whiskers. The solid can also be an electric heat conductor, which is heated inductively, by direct passage of current, or by high frequency. The polycrystalline metal whiskers are attached to the or each surface exposed to the flowing medium to transfer heat thereto. The metal whiskers are attached to the surface of the solid preferably by deposition of metal. Deposition of metal by current-free reduction of a metal compound and galvanic precipitation are suitable methods. Particularly favourable is the deposition of metal through thermal disintegration of a metal compound in the form of vapour, for instance of a metal carbonyl. The separated metal is here not merely deposited in the zone of the points of contact of the whiskers with the surface of the solid, but also on the actual whiskers. The heat transmission can thus be improved if the metal used for separation and deposition is one having good heat conductivity, for example silver. The whiskers could also be attached to the surface of the solid by electron beam welding.

If the largest possible quantity of whiskers per unit area are to be accommodated, it has been found desirable to use metal whiskers that consist at least partially of a ferromagnetic material. These are aligned parallel to one another during their attachment to the surface of the solid by means of a magnetic field. Conveniently these whiskers are of iron or nickel, but they may be metal whiskers with a ferromagnetic core and one or more casings of another metal, for example copper.

For a better understanding of the invention some constructional forms will now be described by way of example, with reference to the accompanying drawing, in which:

FIG. 1 is a diagrammatic side view of polycrystalline metal whiskers attached to the surface of a metal body, FIG. 2 is a plan view corresponding to FIG. 1, FIG. 3 is a section through a heat exchanger with a partition between cavities for two flowing media, the partition being covered on either side with polycrystalline metal whiskers, FIG. 4 is a cross-section of a tubular heat exchanger, FIG. 5 is a cross-section of a tube on whose inner surface parallel polycrystalline metal whiskers are attached and span the inner diameter of the tube, FIG. 6 shows a line of whiskers on a greatly enlarged scale before being joined to the inside of the tube in the manner of FIG. 5, FIG. 7 shows the same line of whiskers after being attached to the inside of the tube by deposition of metal, FIG. 8 is a longitudinal section through an electrical heating conductor, to whose surface polycrystalline metal whiskers are attached, and FIG. 9 is a cross-section of the heating conductor of FIG. 8.

Reference is first made to FIGS. 1 and 2 which show a metal body 1, for example a plate, on whose surface 2 are attached polycrystalline metal whiskers 3. These whiskers 3 may have a diamter of for instance 5 $\mu$m and are heat conducting. The whiskers 3 consist for example of iron or nickel and they are joined to the surface 2 by the galvanic deposition of a layer of silver 4. Deposition takes place on the whiskers 3 themselves, whereby improved heat conduction is obtained. The thickness of the layer 4 may likewise be of the order of a few microns.

It will be assumed that along the surface 2 of the body 1 a liquid flows which is intended to transfer its heat to the body 1. There is then formed an inert boundary layer 5, whose coefficient of heat conductivity is very low and may be of the order of 0.2 to 0.5 Kcal/m.h.° G. Since the coefficient of heat conductivity of the whiskers 3, together with their deposition layers or casings 4, is at least a hundred times that of the liquid, the heat transfer to the body 1 is considerably improved. If the diameter of the whiskers 3 with their casings 4 is 10 μm, and if the distance between neighbouring whiskers is likewise 10 μm, about 20% of the surface 2 of the body 1 is covered with whiskers. If the coefficient of heat conductivity of the liquid forming the boundary layer 5 is 0.2 and if the whiskers 3 with their casings 4 have a coefficient of heat conductivity 100, it is evident that the heat conduction through the whiskers 3 with their casings 4 will be a hundred times that of the heat conduction through the boundary layer 5. It may be noted that the turbulence produced by the whiskers and the heat transmission promoted by it have not yet been taken into consideration.

The length of the whiskers 3 should correspond at least to the thickness of the boundary layer 5 and consequently depends on the viscosity of the flowing medium to be used. The free ends of the whiskers 3 can, as shown, protrude beyond the boundary layer 5 into the flowing medium, still further improving the heat transfer. Moreover, the free ends of the whiskers bring about turbulence, which also interferes with the boundary layer 5 and reduces the thickness thereof.

FIG. 3 shows diagrammatically a heat exchanger which consists of a housing formed from two casings 6 and 7 and in which there is arranged a metal partition 8 which separates two cavities 9 and 10 from one another. These cavities are traversed by liquid or gaseous media. On the surfaces 11 and 12 of the partition 8 are attached polycrystalline metal whiskers.

This heat exchanger can be made by the following process. Polycrystalline metal whiskers are provided in the cavities 9 and 10 and the partition 8 is heated, for example by an electric current, to the temperature of decomposition of a thermally decomposable metal compound. Such a metal compound is then passed in the form of vapour through the cavities 9 and 10 and decomposes, depositing metal at the points of contact of the whiskers with the surfaces 11 and 12 as well as on the whiskers themselves. Finally the non-attached whiskers are blown out of the cavities 9 and 10. Particularly suitable metal compounds for this process are metal carbonyls.

FIG. 4 shows a heat exchanger in the form of two co-axial tubes 13 and 14, the inner tube 13 being coated on its inner and outer surfaces 15 and 16 with whiskers. The whiskers can be attached in a process similar to that described in connection with FIG. 3.

FIG. 5 shows a tube 17 to whose inner surface 18 are attached polycrystalline metal whiskers 19 which span the inner diameter of the tube 17 in parallel chord-like fashion. The whiskers consist in this case wholly or partially of a ferromagnetic metal, such as iron or nickel, and they are aligned parallel to one another by a magnetic field. The individual whiskers are arranged along the lines of force of the magnetic field to form lines as represented diagrammatically on a larger scale in FIG. 6. The tube 17 is then heated to the temperature of decomposition of a thermally decomposable metal compound and this metal compound is passed in vapour form through the tube 17. The compound decomposes in the tube, whereby metal is deposited on the surface of the whiskers and at the points of contact between the whiskers 19 and the inner wall 18 of the tube 17, as shown at 20 in FIG. 7. Thus the 'chords' are solidified in place.

FIG. 8 shows an electrical heating conductor 21, whose surface is coated with an electrically insulating, but thermally conducting, layer 22, for instance a varnish. On the surface of this layer 22, as with the previous examples, there are attached heat conducting polycrystalline metal whiskers. The whiskers can be attached by the heating conductor 21 being inserted in a tube and the space between the heating conductor and the surrounding tube being filled with metal whiskers. The conductor 21 is heated by electric current to the temperature of decomposition of a thermally decomposable metal compound, the compound is passed through the mass of whiskers to deposit metal at the points of contact of the whiskers, and the surface of the insulating layer 22 of the heating conductor 21, and finally the unattached whiskers are blown out.

With the above described methods not only is an improvement in heat transfer achieved, but an enlargement of the heat emitting or absorbing surfaces of the body is obtained. With the dimensions and spacing of the whiskers mentioned in connection with FIGS. 1 and 2 the surface area is already increased three fold if the length of the whiskers is only 20 μm.

I claim:

1. A heat transfer element having at least one surface cooperating in defining a path for conducting a fluid medium, and polycrystalline metal whiskers attached in a heat conducting manner to said surface to thereby increase the heat emitting and absorbing surface area of said element, said whiskers being formed of thin elongated members attached in substantial alignment with overlapping ends to further enhance the conductivity and the strength of the heat transfer element, said whiskers penetrating the boundary layer of the fluid as the fluid is conducted over said surface with the strength of the whiskers being capable of withstanding the pressure of the flowing medium.

2. A heat transfer element according to claim 1 adapted to form a partition between cavities for first and second fluid medium and having opposed surfaces for facing the two medium both with polycrystalline metal whiskers attached in heat conducting manner.

3. A heating device according to claim 2 wherein two coaxial tubes with the inner tube forming the partition between two cavities for first and second fluid medium and having its inner and outer surfaces provided with polycrystalline metal whiskers.

4. An electrical heating device comprising an element according to claim 1, formed as an electrical conductor to whose outer surface polycrystalline metal whiskers are attached in heat conducting manner.

5. A heating device according to claim 4 wherein the conductor is provided with an electrically insulating but heat conducting coating to which the metal whiskers are attached.

* * * * *